United States Patent
Hsiao

(10) Patent No.: US 10,768,855 B1
(45) Date of Patent: Sep. 8, 2020

(54) DATA READING METHOD, STORAGE CONTROLLER AND STORAGE DEVICE

(71) Applicant: Shenzhen EpoStar Electronics Limited CO., Shenzhen (CN)

(72) Inventor: Yu-Hua Hsiao, Hsinchu County (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 0 days.

(21) Appl. No.: 16/423,032

(22) Filed: May 26, 2019

(30) Foreign Application Priority Data

Mar. 27, 2019 (TW) .............................. 108110631 A

(51) Int. Cl.
*G06F 3/06* (2006.01)
*G11C 16/08* (2006.01)
*G11C 16/26* (2006.01)

(52) U.S. Cl.
CPC .......... *G06F 3/0658* (2013.01); *G06F 3/0619* (2013.01); *G06F 3/0679* (2013.01); *G11C 16/08* (2013.01); *G11C 16/26* (2013.01)

(58) Field of Classification Search
CPC .... G06F 3/0619; G06F 3/0658; G06F 3/0679; G06F 11/08; G06F 11/10; G06F 11/1008; G06F 11/1048; G06F 11/1068; G11C 16/08; G11C 16/26

USPC ......... 711/103, 154; 714/6.11, 54, 752, 763, 714/772
See application file for complete search history.

(56) References Cited

U.S. PATENT DOCUMENTS

| | | | |
|---|---|---|---|
| 9,009,576 B1* | 4/2015 | Jeon | H03M 13/1111 714/773 |
| 2014/0281828 A1* | 9/2014 | Micheloni | G06F 11/1048 714/773 |
| 2018/0012663 A1* | 1/2018 | Alhussien | H03M 13/6325 |
| 2020/0026470 A1* | 1/2020 | Yang | G06F 3/064 |

* cited by examiner

*Primary Examiner* — Gary J Portka
(74) *Attorney, Agent, or Firm* — JCIPRNET

(57) ABSTRACT

A memory management method is provided. The method includes: performing a read operation on a target word line; reading a plurality of target physical pages of the target word line to obtain a plurality of hard bit codewords respectively corresponding to the target physical pages; generating soft information of each of a plurality of target memory cells of the target word line according to the hard bit codewords; identifying a plurality of confidence values corresponding to the target physical pages of each of the target memory cells according to a plurality of confidence tables and the soft information of the target memory cells; and performing an adjusted preset decoding operation according to the confidence values and the soft information, so as to obtain a plurality of final decoded codewords respectively corresponding to the target physical pages and complete the read operation.

15 Claims, 8 Drawing Sheets

Setting confidence table corresponding to first read voltage pattern (1/2/4)    |A|<|B|<|C|<|D|

| | G1 | G2 | G3 | G4 | G5 | G6 | G7 | G8 | |
|---|---|---|---|---|---|---|---|---|---|
| Soft information of memory cells | "111" | "110" | "100" | "101" | "001" | "000" | "010" | "011" | 400 |

Bit values corresponding to lower physical pages in soft information: "1" "0"

| Confidence table of lower physical pages | −D | −C | −B | −A | +A | +B | +C | +D | 410 |
|---|---|---|---|---|---|---|---|---|---|
| | 410(1) | 410(2) | 410(3) | 410(4) | 410(5) | 410(6) | 410(7) | 410(8) | |

$v(i)_2$ → $v(i)_4$ →

Bit values corresponding to middle physical pages in soft information: "1" "0" "1"

| Confidence table of middle physical pages | −B | −A | +A | +B | +B | +A | −A | −B | 420 |
|---|---|---|---|---|---|---|---|---|---|
| | 420(1) | 420(2) | 420(3) | 420(4) | 420(5) | 420(6) | 420(7) | 420(8) | |

$v(i)_1$ → $v(i)_3$ → $v(i)_5$ → $v(i)_6$ →

Bit values corresponding to upper physical pages in soft information: "1" "0" "1"

| Confidence table of upper physical pages | −A | +A | +A | −A | −A | +A | +A | −A | 430 |
|---|---|---|---|---|---|---|---|---|---|
| | 430(1) | 430(2) | 430(3) | 430(4) | 430(5) | 43061) | 430(7) | 430(8) | |

Confidence table corresponding to first read voltage pattern (1/2/4)

| Threshold voltage distribution region | G1 | G2 | G3 | G4 | G5 | G6 | G7 | G8 |
|---|---|---|---|---|---|---|---|---|
| Soft information of memory cells | "111" | "110" | "100" | "101" | "001" | "000" | "010" | "011" |
| Confidence table of lower physical pages | "−8" | "−6" | "−4" | "−2" | "+2" | "+4" | "+6" | "+8" |
| Confidence table of middle physical pages | "−4" | "−2" | "+2" | "+4" | "+4" | "+2" | "−2" | "−4" |
| Confidence table of upper physical pages | "−2" | "+2" | "−2" | "+2" | "−2" | "+2" | "−2" | "+2" |

A=2; B=4; C=6; D=8

|A|<|B|<|C|<|D|

FIG. 4B

Setting confidence table corresponding to second read voltage pattern (2/3/2)    |A|<|B|<|C|

| | G1 | G2 | G3 | G4 | G5 | G6 | G7 | G8 | |
|---|---|---|---|---|---|---|---|---|---|
| Soft information of memory cells | "111" | "011" | "001" | "000" | "010" | "110" | "100" | "101" | 500 |

Bit values corresponding to lower physical pages in soft information: $V(i)_1$ "1" "1" "0" "0" "1" "1" "0"

| Confidence table of lower physical pages | −A | +A | +B | +B | +A | −A | −B | −C | 510 |
|---|---|---|---|---|---|---|---|---|---|
| | 510(1) | 510(2) | 510(3) | 510(4) | 510(5) | 510(6) | 510(7) | 510(8) | |

Bit values corresponding to middle physical pages in soft information: $V(i)_2$ $V(i)_3$ $V(i)_4$ "1" "1" "0" "0" "1" "1" "0"

| Confidence table of middle physical pages | −B | −A | +A | +A | −A | −A | +A | +B | 520 |
|---|---|---|---|---|---|---|---|---|---|
| | 520(1) | 520(2) | 520(3) | 520(4) | 520(5) | 520(6) | 520(7) | 520(8) | |

Bit values corresponding to upper physical pages in soft information: $V(i)_7$ "1" "0" "0" "0" "1"

| Confidence table of upper physical pages | −C | −B | −A | +A | +B | +B | +A | −A | 530 |
|---|---|---|---|---|---|---|---|---|---|
| | 530(1) | 530(2) | 530(3) | 530(4) | 530(5) | 530(6) | 530(7) | 530(8) | |

FIG. 5A

Confidence table corresponding to second read voltage pattern (2/3/2)

| Threshold voltage distribution region | G1 | G2 | G3 | G4 | G5 | G6 | G7 | G8 |
|---|---|---|---|---|---|---|---|---|
| Soft information of memory cells | "111" | "011" | "001" | "000" | "010" | "110" | "100" | "101" |
| Confidence table of lower physical pages | "−2" | "+2" | "+4" | "+4" | "+2" | "−2" | "−4" | "−6" |
| Confidence table of middle physical pages | "−4" | "−2" | "+2" | "+2" | "−2" | "−2" | "−4" | "+4" |
| Confidence table of upper physical pages | "−6" | "−4" | "−2" | "+2" | "+4" | "+4" | "+2" | "−2" |

A=2 ; B=4 ; C=6

|A|<|B|<|C|

FIG. 5B

DATA READING METHOD, STORAGE CONTROLLER AND STORAGE DEVICE

CROSS-REFERENCE TO RELATED APPLICATION

This application claims the priority benefit of Taiwan application serial no. 108110631, filed on Mar. 27, 2019. The entirety of the above-mentioned patent application is hereby incorporated by reference herein and made a part of this specification.

BACKGROUND

Technical Field

The invention relates to a data reading method, and more particularly, to a data reading method adapted to a storage device disposed with a rewritable non-volatile memory module and a storage controller thereof.

Description of Related Art

In general, when an iterative decoding operation (e.g., a low density parity check code decoding operation) performed on a codeword read from a physical page of the rewritable non-volatile memory module is failed, the storage controller of the memory device will try to correct a log-likelihood ratio table of the iterative decoding operation according to verified data (e.g., known data pre-stored in the rewritable non-volatile memory module), so as to perform the iterative decoding operation on the read codeword again by using a calibrated log-likelihood ratio table.

However, the conventional method needs to additionally prepare the known verified data (i.e., by storing the known verified data into a plurality of word lines of the rewritable non-volatile memory module). Since the conventional method needs to use a spare space of the rewritable non-volatile memory module to store the verified data, a remaining available space of the rewritable non-volatile memory module is reduced accordingly. Consequently, an operational efficiency of the storage device is reduced due to the reduced remaining available space (because many of management operations in the storage device will require the use of the remaining available space).

Therefore, how to efficiently use other methods to replace the log likelihood ratio table corresponding to the iterative decoding operation without preparing the verified data to overcome the defects in the conventional method, improve a performance of the decoding operation, and improve a data reading efficiency of the rewritable non-volatile memory module is one of issues to be addressed by persons skilled in art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The data reading method, the storage controller and the storage device provided by the embodiments of the invention can obtain a plurality of hard bit codes by reading a plurality of target physical pages of a target word line and generate soft information of each of the target memory cells of the target word line by using the hard bit codewords without preparing verified data. Further, a plurality of confidence values corresponding to the target physical pages of the target memory cells may be found and an adjusted iterative decoding operation may be performed according to the confidence values, so as to enhance a decoding capability and improve an efficiency of the read operation.

An embodiment of the invention provides a data reading method adapted to a storage device disposed with a rewritable non-volatile memory module. The rewritable non-volatile memory module has a plurality of word lines. Each word line among the word lines is coupled to a plurality of memory cells. Each memory cell among the memory cells includes a plurality of physical pages, and each physical page among the physical pages is configured to be programmed as a bit value. The method includes: selecting a target word line, and performing a read operation on the target word line; using a preset read voltage set to read a plurality of target physical pages of the target word line, so as to obtain a plurality of hard bit codewords respectively corresponding to the target physical pages; generating soft information of each of a plurality of target memory cells of the target word line according to the hard bit codewords; identifying a plurality of confidence values corresponding to the target physical pages of each of the target memory cells according to a plurality of confidence tables respectively corresponding to the target physical pages and the soft information of the target memory cells, wherein each of the confidence tables has a plurality of preset confidence values respectively corresponding to a plurality of threshold voltage distribution regions, wherein the threshold voltage distribution regions correspond to a plurality of gray code patterns; and using the confidence values of the target memory cells to replace a plurality of log-likelihood ratios corresponding to the target memory cells in a preset decoding operation, and performing an adjusted preset decoding operation having the replaced log-likelihood ratios on the soft information, so as to obtain a plurality of final decoded codewords respectively corresponding to the target physical pages and complete the read operation.

An embodiment of the invention provides a storage controller, which is configured to control a storage device having a rewritable non-volatile memory module. The storage controller includes a connection interface circuit, a memory interface control circuit, a read assisting circuit unit and a processor. The connection interface circuit is configured to couple to a host system. The memory interface control circuit is configured to couple to the rewritable non-volatile memory module. The rewritable non-volatile memory module has a plurality of word lines. Each word line among the word lines is coupled to a plurality of memory cells. Each memory cell among the memory cells includes a plurality of physical pages, and each physical page among the physical pages is configured to be programmed as a bit value. The processor is coupled to the connection interface circuit, the memory interface control circuit, the read assisting circuit unit and the error checking and correcting circuit. The processor is configured to select a target word line among the word lines of the rewritable non-volatile memory module, and perform a read operation on the target word line. The read assisting circuit unit is configured to use a preset read voltage set to read a plurality of target physical pages of the target word line, so as to obtain a plurality of hard bit codewords respectively corresponding to the target physical pages. The read assisting circuit unit is further configured to generate soft information of each of a plurality of target memory cells of the target word line according to the hard bit codewords. The read assisting circuit unit is further configured to identify a plurality of confidence values corresponding to the target physical pages of each of the target memory cells according to a plurality of confidence tables respectively corresponding to the target physical pages and the soft information of the target memory cells. Each of the confidence tables has a plurality of preset confidence values respectively corresponding to a plurality of threshold voltage distribution regions. The threshold voltage distribution regions correspond to a plurality of gray code patterns. The error checking and correcting circuit is configured to use the confidence values of the target memory cells to replace a plurality of log-likelihood ratios corresponding to the target memory cells in a preset decoding operation, and perform an adjusted preset decoding operation having the replaced log-likelihood ratios on the soft information, so as to obtain a plurality of final decoded codewords respectively corresponding to the target physical pages and thereby complete the read operation.

An embodiment of the invention provides a storage device. The storage device includes a rewritable non-volatile memory module, a memory interface control circuit and a processor. The rewritable non-volatile memory module has a plurality of word lines. Each word line among the word lines is coupled to a plurality of memory cells. Each memory cell among the memory cells includes a plurality of physical pages, and each physical page among the physical pages is configured to be programmed as a bit value. The memory interface control circuit is configured to couple to the rewritable non-volatile memory module. The processor is coupled to the memory interface control circuit. The processor loads in and executes a read assisting program code module to realize a data reading method. The data reading method includes: selecting a target word line, and performing a read operation on the target word line; using a preset read voltage set to read a plurality of target physical pages of the target word line, so as to obtain a plurality of hard bit codewords respectively corresponding to the target physical pages; generating soft information of each of a plurality of target memory cells of the target word line according to the hard bit codewords; identifying a plurality of confidence values corresponding to the target physical pages of each of the target memory cells according to a plurality of confidence tables respectively corresponding to the target physical pages and the soft information of the target memory cells, wherein each of the confidence tables has a plurality of preset confidence values respectively corresponding to a plurality of threshold voltage distribution regions, wherein the threshold voltage distribution regions correspond to a plurality of gray code patterns; and using the confidence values of the target memory cells to replace a plurality of log-likelihood ratios corresponding to the target memory cells in a preset decoding operation, and performing an adjusted preset decoding operation having the replaced log-likelihood ratios on the soft information, so as to obtain a plurality of final decoded codewords respectively corresponding to the target physical pages and complete the read operation.

Based on the above, the data reading method, the storage controller and the storage device provided by the embodiments of the invention can obtain the hard bit codes by reading the target physical pages of the target word line and generate the soft information of each of the target memory cells of the target word line by using the hard bit codewords without preparing the verified data. Next, the data reading method, the storage controller and the storage device provided by the embodiments of the invention can further obtain the confidence values corresponding to the target physical pages by checking the confidence tables corresponding to the target physical pages, and thereby perform the adjusted iterative decoding operations according to the confidence values corresponding to the target physical pages of the target memory cells, so as to enhance the decoding capability and improve the efficiency of the read operation. As a result, a correct rate and a reliability of the data read form the target word line may be improved to reduce loading of the decoding operation performed on the read data and thereby improve an overall efficiency of the data reading operation.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4A illustrates a schematic diagram for setting a confidence table corresponding to the first read voltage pattern (1/2/4) according to an embodiment of the invention.

FIG. 4B is a schematic diagram illustrating the confidence table corresponding to the first read voltage pattern (1/2/4) according to an embodiment of the invention.

FIG. 5A illustrates a schematic diagram for setting a confidence table corresponding to the second read voltage pattern (2/3/2) according to an embodiment of the invention.

FIG. 5B is a schematic diagram illustrating the confidence table corresponding to the second read voltage pattern (2/3/2) according to an embodiment of the invention.

DESCRIPTION OF THE EMBODIMENTS

Figure 1:
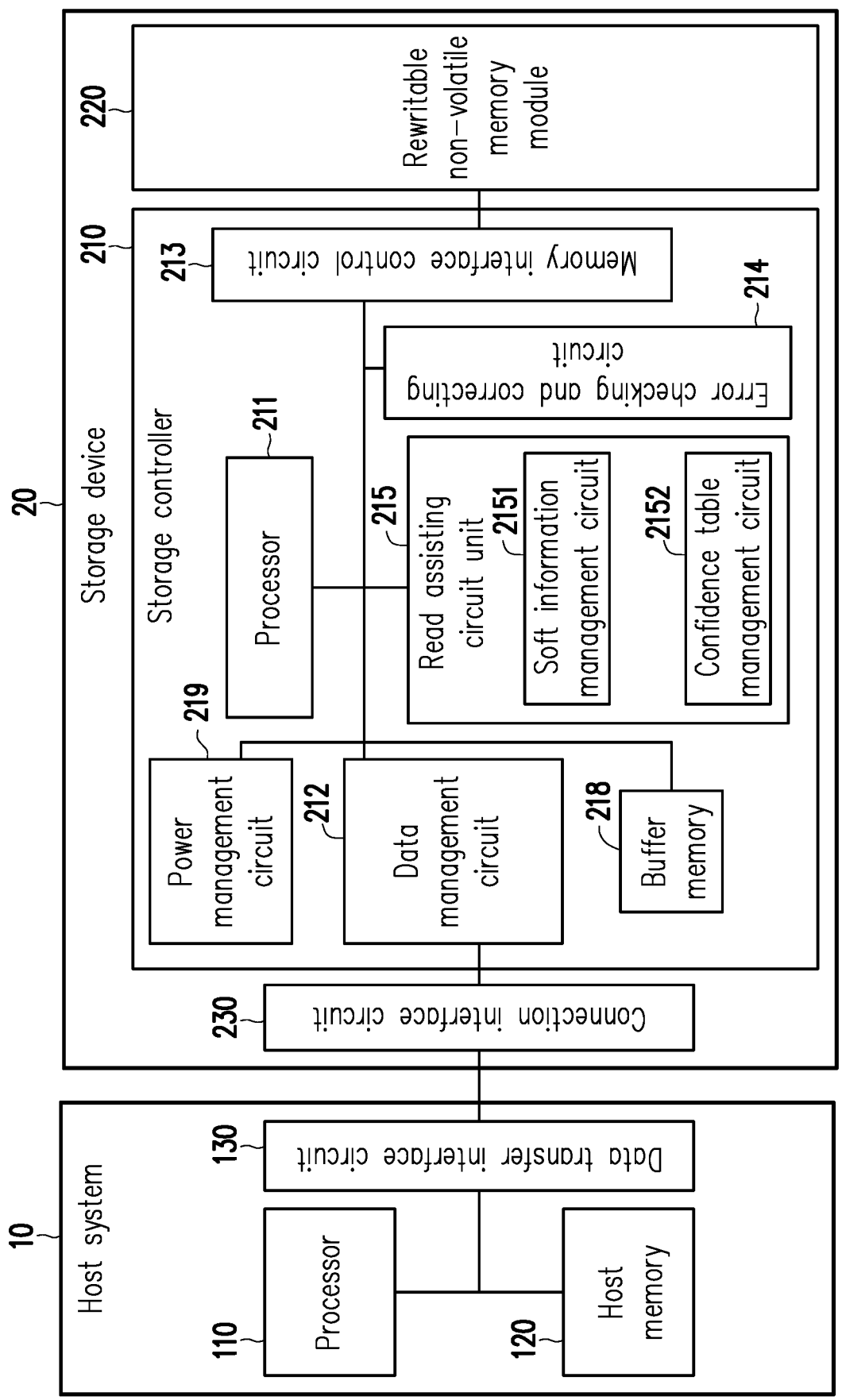
FIG. 1 is a block diagram illustrating a host system and a storage device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In the present embodiment, a storage device includes a rewritable non-volatile memory module and a storage device controller (a.k.a. a storage controller or a storage control circuit). Also, the storage device is usually used together with a host system so the host system can write data into or read data from the storage device.

FIG. 1A is a block diagram illustrating a host system and a storage device according to an embodiment of the invention.

With reference to FIG. 1A a host system 10 includes a processor 110, a host memory 120 and a data transfer interface circuit 130. In this embodiment, the data transfer interface circuit 130 is coupled (or, electrically connected) to the processor 110 and the host memory 120. In another embodiment, the processor 110, the host memory 120 and the data transfer interface circuit 130 are coupled to one another by utilizing a system bus.

A storage device 20 includes a storage controller 210, a rewritable non-volatile memory module 220 and a connection interface circuit 230. Among them, the storage controller 210 includes a processor 211, a data management circuit 212 and a memory interface control circuit 213.

In this embodiment, the host system 10 is coupled to the storage device 20 through the data transfer interface circuit 130 and the connection interface circuit 230 of the storage device 20 to perform a data accessing operation. For example, the host system 10 can store data to the storage device 20 or read data from the storage device 20 through the data transfer interface circuit 130.

In the present embodiment, the processor 110, the host memory 120 and the data transfer interface circuit 130 may be disposed on a main board of the host system 10. The number of the data transfer interface circuit 130 may be one or more. Through the data transfer interface circuit 130, the main board may be coupled to the storage device 20 in a wired manner or a wireless manner. The storage device 20 may be, for example, a flash drive, a memory card, a solid state drive (SSD) or a wireless memory storage device. The wireless memory storage device may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board may also be coupled to various I/O devices including a GPS (Global Positioning System) module, a network interface card, a wireless transmission device, a keyboard, a monitor and a speaker through the system bus.

In the present embodiment, the data transfer interface circuit 130 and the connection interface circuit 230 are an interface circuit compatible with a Peripheral Component Interconnect Express (PCI Express) interface standard. Further, a data transfer is performed between the data transfer interface circuit 130 and the connection interface circuit 230 by using a communication protocol of a Non-Volatile Memory express (NVMe) interface standard.

Nevertheless, it should be understood that the invention is not limited in this regard. The data transfer interface circuit 130 and the connection interface circuit 230 may also be compatible to a PATA (Parallel Advanced Technology Attachment) standard, an IEEE (Institute of Electrical and Electronic Engineers) 1394 standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC interface standard, a UFS (Universal Flash Storage) interface standard, an eMCP interface standard, a CF interface standard, an IDE (Integrated Device Electronics) interface standard or other suitable standards. Further, in another embodiment, the connection interface circuit 230 and the storage controller 210 may be packaged into one chip, or the connection interface circuit 230 is distributed outside a chip containing the storage controller 210.

In this embodiment, the host memory 120 is configured to temporarily store commands executed by the processor 110 or data. For instance, in the present exemplary embodiment, the host memory 120 may be a Dynamic Random Access Memory (DRAM), or a Static Random Access Memory (SRAM) and the like. Nevertheless, it should be understood that the invention is not limited thereto, and the host memory 120 may also be other appropriate memories.

The storage unit 210 is configured to execute a plurality of logic gates or control commands, which are implemented in a hardware form or in a firmware form, and to perform operations of writing, reading or erasing data in the rewritable non-volatile memory storage module 220 according to the commands of the host system 10.

More specifically, the processor 211 in the storage controller 210 is a hardware with computing capabilities, which is configured to control overall operation of the storage controller 210. Specifically, the processor 211 has a plurality of control commands and the control commands are executed to perform various operations such as writing, reading and erasing data during operation of the storage device 20.

It is noted that, in this embodiment, the processor 110 and the processor 211 are, for example, a central processing unit (CPU), a micro-processor, other programmable microprocessors, a digital signal processor (DSP), a programmable controller, an application specific integrated circuits (ASIC), a programmable logic device (PLD) or other similar circuit elements, which are not particularly limited by the invention.

In an embodiment, the storage controller 210 further includes a ROM (not illustrated) and a RAM (not illustrated). More particularly, the ROM has a boot code, which is executed by the processor 211 to load the control commands stored in the rewritable non-volatile memory module 220 into the RAM of the storage controller 210 when the storage controller 210 is enabled. Then, the control commands are executed by the processor 211 to perform operations, such as writing, reading or erasing data. In another embodiment, the control commands of the processor 211 may also be stored as program codes in a specific area (for example, physical storage units in the rewritable non-volatile memory module 220 dedicated for storing system data) of the rewritable non-volatile memory module 220.

In this embodiment, as described above, the storage controller 210 further includes the data management circuit 212 and the memory interface control circuit 213. It should be noted that, operations performed by each part of the storage controller 210 may also be regarded as operations performed by the storage controller 210.

The data management circuit 212 is coupled to the processor 211, the memory interface control circuit 213 and the connection interface circuit 230. The data management circuit 212 is configured to transmit data under instruction of the processor 211. For example, the data may be read from the host system 10 (e.g., the host memory 120) through the connection interface circuit 230, and the read data may be written into the rewritable non-volatile memory module 220 through the memory interface control circuit 213 (e.g., a write operation performed according to the write command from the host system 10). As another example, the data may be read from one or more physical units of the rewritable non-volatile memory module 220 through the memory interface control circuit 213 (the data may be read from one or more memory cells in one or more physical units), and the read data may be written into the host system 10 (e.g., the host memory 120) through the connection interface circuit 230 (e.g., a read operation performed according to a read command from the host system 10). In another embodiment, the data management circuit 212 may also be integrated into the processor 211.

The memory interface control circuit 213 is configured to perform write (or, programming) operation, read operation and erase operation for the rewritable non-volatile memory module 220 together with the data management circuit 212 under instruction of the processor 211.

For instance, the processor 211 can execute a write command sequence to instruct the memory interface control circuit 213 to write the data into the rewritable non-volatile memory module 220; the processor 211 can execute a read command sequence to instruct the memory interface control circuit 213 to read the data from one or more physical units (a.k.a. target physical units) corresponding to the read command in the rewritable non-volatile memory module 220; the processor 211 can execute an erase command sequence to instruct the memory interface control circuit 213 to perform the erasing operation for the rewritable non-volatile memory module 220. Each of the write command sequence, the read command sequence and the erase command sequence may include one or more program codes or command codes, respectively, and instruct the rewritable non-volatile memory module 220 to perform the corresponding operations, such as writing, reading and erasing. In an embodiment, the processor 211 can further give other command sequences to the memory interface control circuit 213 so as to perform the corresponding operations for the rewritable non-volatile memory module 220.

In addition, data to be written to the rewritable non-volatile memory module 220 is converted into a format acceptable by the rewritable non-volatile memory module 220 through the memory interface control circuit 213. Specifically, when the processor 211 attempts to access the rewritable non-volatile memory module 220, the processor 211 sends the corresponding command sequences to the memory interface control circuit 213 in order to instruct the memory interface control circuit 213 to perform the corresponding operations. For example, the command sequences may include the write command sequence as an instruction for writing data, the read command sequence as an instruction for reading data, the erase command sequence as an instruction for erasing data, and other corresponding command sequences as instructions for various memory operations (e.g., changing a plurality of preset read voltage values of a preset read voltage set to perform the read operation or a read assisting operation, or performing a garbage collection procedure). The command sequences may include one or more signals, or data transmitted in the bus. The signals or the data may include command codes and program codes. For example, information such as identification codes and memory addresses are included in the read command sequence.

The rewritable non-volatile memory module 220 is coupled to the storage controller 210 (the memory control circuit unit 213) and configured to store data written from the host system 10. The rewritable non-volatile memory module 220 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Quadruple Level Cell) NAND flash memory module (i.e., a flash memory module capable of storing four bits in one memory cell), a 3D NAND flash memory module or a vertical NAND flash memory module, a vertical NAND flash memory module or a vertical NAND flash memory module other flash memory modules or any memory module having the same features. The memory cells in the rewritable non-volatile memory module 220 are disposed in an array.

In this embodiment, the rewritable non-volatile memory module 220 has a plurality of word lines, wherein each word line among the word lines is coupled to a plurality of memory cells. The memory cells on the same word line compose one or more physical programming units. In addition, a plurality of physical programming units can compose one physical unit (a physical block or a physical erasing unit). In this embodiment, the TLC (Triple Level Cell) NAND flash memory is taken as an example. That is to say, in the following embodiment, one memory cell capable of storing three bit values is used as one physical programming unit (i.e., in each programming operation, the data is programmed by applying a programming voltage one by one on the physical programming units). Here, each memory cell may have a lower physical page, a middle physical page and an upper physical page.

In this embodiment, the memory cell is used as a minimum unit for writing (programming) data. The physical unit is a minimum unit for erasing (i.e., each physical unit includes a minimum number of memory cells to be erased together).

The following embodiment explains a read assisting operation with the TLC NAND flash memory module used as an example (the read assisting operation is performed on a plurality of memory cells included by a specific word line). A data reading method used by the read assisting operation is also described as follows. Nonetheless, the read assisting operation and the data reading method provided by this embodiment are also applicable to other types of flash memory modules.

The storage controller 210 assigns a plurality of logical units for the rewritable non-volatile memory module 220. The host system 10 accesses user data stored in a plurality of physical units through the assigned logical units. Here, each of the logical units may be composed of one or more logical addresses. For example, the logical unit may be a logical block, a logical page, or a logical sector. One logical unit may be mapped to one or more physical units, where the physical unit may be one or more physical addresses, one or more physical sectors, one or more physical programming units, or one or more physical erasing units. In this embodiment, the logical unit is a logical block, and the logical sub-unit is a logical page. Each logical unit includes a plurality of logical sub-units.

For instance, the storage controller 210 can create a logical to physical address mapping table and a physical to logical address mapping table for recording a mapping relation between the logical units (e.g., the logical blocks, the logical pages or the logical sectors) assigned to the rewritable non-volatile memory module 220 and the physical units (e.g., the physical erasing units, the physical programming units or the physical sectors). In other words, the storage controller 210 can find the physical unit mapped to one logical unit by using the logical to physical address mapping table, and the storage controller 210 can find the logical unit mapped to one physical unit by using the physical to logical address mapping table. Nonetheless, the technical concept for the mapping relation between the logical units and the physical units is a well-known technical means in the field and is not a technical solution to be described in the invention.

In this embodiment, the error checking and correcting circuit 214 is coupled to the processor 211 and configured to execute an error checking and correcting procedure to ensure correctness of data. Specifically, when the processor 211 receives the write command from the host system 10, the error checking and correcting circuit 214 generates an ECC (error correcting code) and/or an EDC (error detecting code) for data corresponding to the write command, and the processor 211 writes data corresponding to the write command and the corresponding ECC and/or the EDC into the rewritable non-volatile memory module 220. Then, when the processor 211 reads the data from the rewritable non-volatile memory module 220, the ECC and/or the EDC corresponding to the data are also read, and the error checking and correcting circuit 214 performs the error checking and correcting procedure on the read data based on the ECC and/or the EDC. In addition, after the error checking and correcting procedure is completed, if the read data is successfully decoded, the error checking and correcting circuit 214 can transmit an error bit count back to the processor 211.

In this embodiment, iterative decoding operations performed by the error checking and correcting circuit 214 adopt a low density parity code (LDPC) algorithm (a.k.a. an LDPC iterative decoding operation). Specifically, after receiving a codeword to be decoded (a.k.a. a target codeword or an raw codeword), the error checking and correcting circuit 214 starts to perform the iterative decoding operations on the received codeword, identify a plurality of data bits of the codeword, check a corresponding table log-likelihood ratio table (a.k.a. LLR table) according to the data bits to obtain a plurality of log likelihood ratios corresponding to the data bits, and perform one iterative decoding operation on the codeword according to the log likelihood ratios and soft information corresponding to the codeword. The iterative decoding operation performed on the codeword according to the log-likelihood ratios and the soft information corresponding to the codeword may also be referred to as a soft decoding operation.

In this embodiment, each time when the error checking and correcting circuit 214 completes one iterative decoding operation performed on one codeword, the error checking and correcting circuit 214 can obtain a decoded codeword and a syndrome corresponding to the decoded codeword. The error checking and correcting circuit 214 can determine whether the iterative decoding operation currently performed is successful or failed according to the syndrome.

If the decoding is failed, the error checking and correcting circuit 214 can determine whether one or more subsequent iterative decoding operations need to be performed again according to a total number of the iterative decoding operations performed on the codeword being counted and a preset iteration count threshold. If the total number is greater than the iteration count threshold, the error checking and correcting circuit 214 determines that a preset decoding operation (the preset decoding operation may include one or more iterative decoding operations) for the codeword is failed, and outputs the last decoded codeword obtained and the corresponding syndrome; if the total number is not greater than the preset iteration count threshold, the error checking and correcting circuit 214 uses the decoded codeword obtained and the corresponding syndrome to re-perform the next iterative decoding operation. Based on demands, manufacturers can set the preset iteration count threshold, which is not particularly limited in the invention.

Each time (each round) in the end of the iterative decoding operation, the error checking and correcting circuit 214 calculates the syndrome corresponding to the last decoded codeword currently obtained, so as to determine whether the iterative decoding operation is successful this time. If the decoding is successful (the codeword generated after the decoding is correct, i.e., a valid codeword), the current iterative operation is ended, and the preset decoding operation for the codeword is also ended; if the decoding is failed (the codeword generated after the decoding is incorrect, i.e., an invalid codeword) and the total number is not greater than the preset iteration count threshold, the current iterative operation is ended and one new (the next) iterative operation is then started.

More specifically, in each iterative decoding operation, the error checking and correcting circuit 214 determines whether a plurality of bit values of the syndrome corresponding to the decoded codeword are all zero. If the bit values of the syndrome are all zero (i.e., "0"), the error checking and correcting circuit 214 determines that the decoded codeword is correct, completes the current iterative decoding operation, completes the preset decoding operation corresponding to the codeword, and outputs the decoded codeword being the valid codeword to thereby complete the read operation corresponding to the raw codeword.

Conversely, if the bit values of the syndrome are not all zero (i.e., having one or more "1"), the error checking and correcting circuit 214 determines that the decoded codeword is incorrect, and ends the current iterative decoding operation and the preset decoding operation corresponding to the codeword. In this embodiment, the error checking and correcting circuit 214 further determines whether a total number of the bit values "1" of the syndrome corresponding to the decoded codeword is less than a total number of the bit values "1" of the syndrome obtained in the previously performed iterative decoding operation. If so, the error checking and correcting circuit 214 identifies the decoded codeword as a smallest syndrome codeword, identifies the corresponding syndrome as a smallest syndrome, and outputs the smallest syndrome codeword and the smallest syndrome. The smallest syndrome codeword and the smallest syndrome may be stored into a corresponding buffer area of the buffer memory.

It should be noted that, the above description is only used to explain the correspondence between the raw codeword, the decoded codeword and the corresponding syndrome. Other details regarding the iterative decoding operation, the raw codeword, the syndrome and the decoded codeword in the low-density parity check code algorithm are not the technical solutions of this invention, and thus are not described herein.

In an embodiment, the storage controller 210 further includes a buffer memory 218 and a power management circuit 219. The buffer memory is coupled to the processor 211 and configured to temporarily store data and commands from the host system 10, data from the rewritable non-volatile memory module 220 or other system data (e.g., the log-likelihood ratio table and the confidence table) for managing the storage device 20 so the processor 211 can quickly access the data, the commands or the system data from the buffer memory 218. The power management circuit 219 is coupled to the processor 211 and configured to control power of the storage device 20.

In this embodiment, a read assisting circuit unit 215 includes a soft information management circuit 2151 and a confidence table management circuit 2152. The read assisting circuit unit 215 is configured to perform a read assisting operation on a specific physical page of a plurality of word lines. More specifically, at a specific time point, the processor 211 can select one word line (a.k.a. a target word line) among the word lines belonging to a plurality of physical units of the rewritable non-volatile memory module 220, and instruct the read assisting circuit unit 215 to perform the read assisting operation on the target word line.

For instance, the specific time point includes, but not limited to: (1) when the decoding operation is failed; (2) when the read operation is performed on the word line with a poorer physical state (e.g., a word line with higher erase count, higher read count, longer retention time or higher error bit count); or (3) when the number of error bits of data read from one word line exceeds an error bit count threshold.

Specifically, when the error bit count of the data read from one physical page corresponding to one word line exceeds the error bit count threshold, that word line is selected as the target word line. It should be noted that, the selected target word line is already stored with data, i.e., programmed with data. In this embodiment, the already stored data is neither the known data preset by manufacturers or the system, nor the verified data (e.g., the already stored data is the user data).

In this embodiment, the soft information management circuit 2151 can perform a soft information operation on the target word line to obtain soft information of each of a plurality of target memory cells of the target word line. Before the soft information operation is to be described, the concept of storage state needs to be explained first. In this embodiment, as described above, the target word line is stored with data. Specifically, each of the memory cells of each word line can include one or more physical pages (each physical page stores one bit value), and each memory cell is programmed to store the bit values corresponding to one of a plurality of different gray code patterns, and a total number of the gray code patterns is P. Here, a total number of the bit values stored by each gray code pattern is equal to a total number of the physical pages included by each memory cell. P is a first predetermined positive integer greater than 2, and a value of P may be set in advance according to a type of the rewritable non-volatile memory module 220. For example, if the rewritable non-volatile memory module 220 is the MLC, P=4, and the total number of the bit values stored by each gray code pattern is equal to 2; if the rewritable non-volatile memory module 220 is the SLC, P=2, and the total number of the bit values stored by each gray code pattern is equal to 1; if the rewritable non-volatile memory module 220 is the QLC, P=16, and the total number of the bit values stored by each gray code pattern is equal to 4.

For descriptive convenience, the present embodiment takes the TLC NAND flash memory module as an example, in which the memory cells of the target word line can store the bit values respectively corresponding to 8 gray code patterns (P=8), and the total number of the bit values stored by each gray code pattern is equal to 3. Details regarding the gray code patterns are described below with reference to FIG. 3A.

Figure 3A:
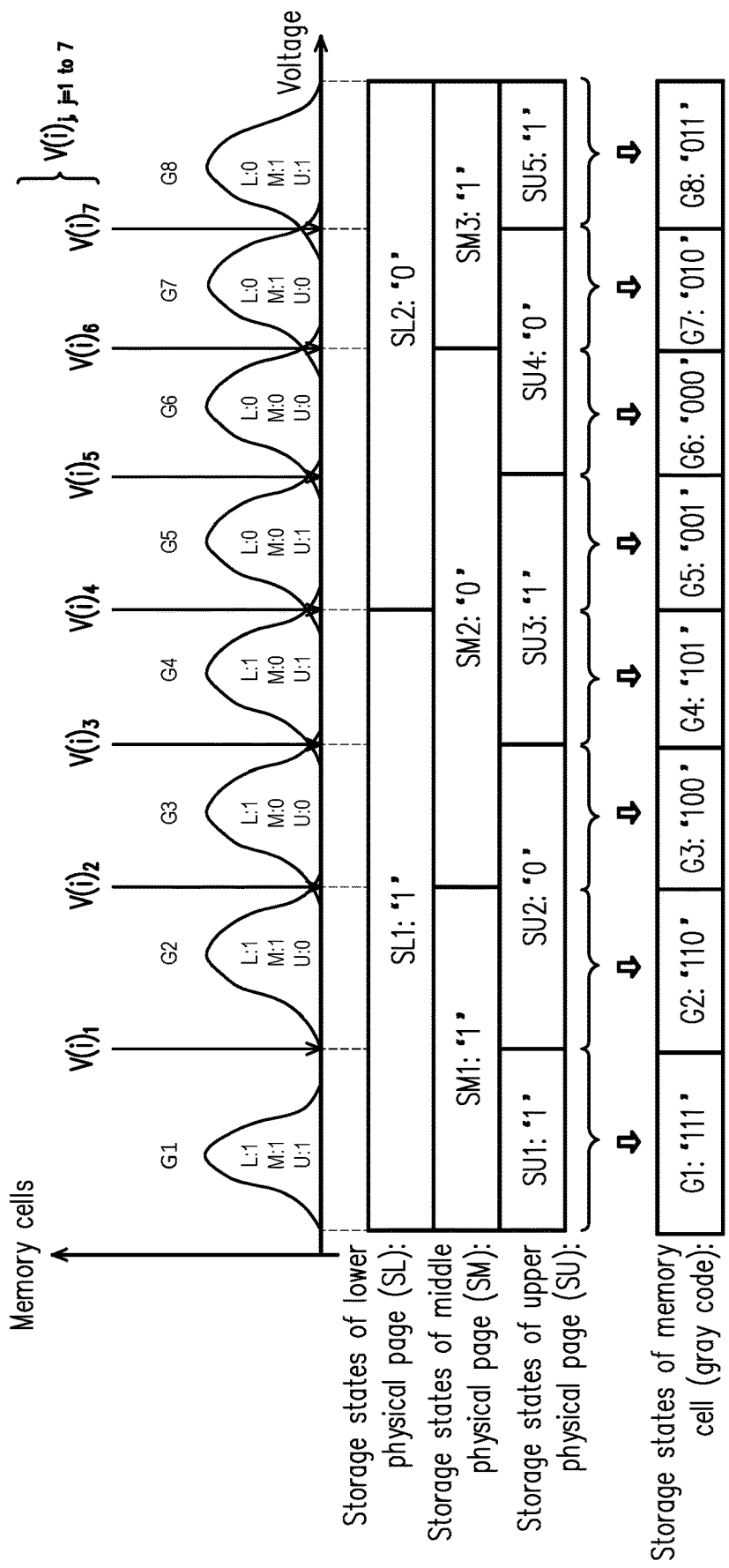
FIG. 3A is a schematic diagram illustrating a threshold voltage distribution of a first read voltage pattern (1/2/4) and a corresponding gray code pattern according to an embodiment of the invention.

FIG. 3A is a schematic diagram illustrating a threshold voltage distribution of a first read voltage pattern (1/2/4) and a corresponding gray code pattern according to an embodiment of the invention. Since this embodiment takes the TLC NAND flash memory module as an example of the rewritable non-volatile memory module 220, P is equal to 8 (i.e., $2^3$). Each memory cell of the TLC NAND flash memory module has three physical pages for storing bit data, respectively, and each memory cell includes the lower physical page (L), the middle physical page (M) and the upper physical page (U), each of which is capable of storing one bit value. It is assumed that, the processor 211 reads a plurality of memory cells (a plurality of target memory cells) of the target word line of the TLC NAND flash memory module by using a plurality of transition read voltages $V(i)_1$ to $V(i)_7$ in a preset read voltage set V(i), and accordingly identifies the different bit values stored by the memory cells (the bit values respectively corresponding to the different gray code patterns). According to the transition read voltages $V(i)_1$ to $V(i)_7$ in the preset read voltage set V(i), a gate voltage in each memory cell may be divided into 8 gray code patterns, such as "L:1 M:1 U:1", "L:1 M:1 U:0", "L:1 M:0 U:0", "L:1 M:0 U:1", "L:0 M:0 U:1", "L:0 M:0 U:0", "L:0 M:1 U:0" and "L:0 M:1 U:1" ("L:" indicates the bit value of the lower physical page; "M:" indicates the bit value of the middle physical page; "U:" indicates the bit value of the upper physical page). The 8 gray code patterns may also be expressed by 8 bit value combinations, including "111", "110", "100", "101", "001", "000", "010" and "011". Here, an order of the bit values in each bit value combination is based on an order of the lower, middle and upper physical pages in that sequence. In other words, by applying the read voltages $V(i)_1$ to $V(i)_7$ with different voltage values in the read voltage set V(i) to one memory cell of the target word line, the processor 211 can determine the bit values stored by that memory cell (a.k.a. the bit data or a read bit value) corresponding to one of the gray code patterns ("111", "110", "100", "101", "001", "000", "010" and "011") according to whether a channel of that memory cell is turned on (i.e., using the preset read voltage set V(i) to read the read the bit values from the one memory of the target word line).

In this embodiment, the threshold voltage distribution of the word line may be divided into a plurality of threshold voltage distribution regions according to the corresponding transition read voltages. The threshold voltage distribution regions and the gray code patterns are in a one-to-one mapping relationship. With reference to FIG. 3A, a threshold voltage distribution region G1 corresponds to a gray code pattern "111"; a threshold voltage distribution region G2 corresponds to a gray code pattern "110"; a threshold voltage distribution region G3 corresponds to a gray code pattern "100"; a threshold voltage distribution region G4 corresponds to a gray code pattern "101"; a threshold voltage distribution region G5 corresponds to a gray code pattern "001"; a threshold voltage distribution region G6 corresponds to a gray code pattern "000"; a threshold voltage distribution region G7 corresponds to a gray code pattern "010"; a threshold voltage distribution region G8 corresponds to a gray code pattern "011". Further, in this embodiment, if the gray code pattern corresponding to the storage state of one memory cell is "011", that memory cell may be regarded as belonging to the threshold voltage distribution region G8, or the threshold voltage distribution of that memory cell may be regarded as belonging to the threshold voltage distribution region G8.

It should be noted that, according to the total number of the gray code patterns that can be included by the memory cell of the rewritable non-volatile memory module 220 (which is 8 in this example), the processor 211 can determine a total number of the transition read voltages of the preset read voltage set. Here, the total number of the transition read voltages of the preset read voltage set is the total number of the gray code patterns minus one (which is 7 in this example, i.e., N−1=8−1=7). In addition, a total number of the threshold voltage distribution regions is also equal to the total number of the gray code patterns.

More specifically, the storage state (a.k.a. the gray code) corresponding to one gray code pattern stored by one memory may be formed by storage states of the lower physical page (SL), storage states of the middle physical page (SM) and storage states of the upper physical page (SU) in that sequence (as shown by multiple arrows in FIG. 3A).

In this embodiment, the transition read voltage $V(i)_4$ is configured to divide storage states SL1 ("1") and SL2 ("0") of the lower physical page; the transition read voltages $V(i)_2$ and $V(i)_6$ are configured to divide storage states SM1 ("1"), SM2 ("0") and SM3 ("1") of the middle physical page; the transition read voltages $V(i)_1$, $V(i)_3$, $V(i)_5$ and $V(i)_7$ are configured to divide storage states SU1 ("1"), SU2 ("0"), SU3 ("1"), SU4 ("0") and SU5 ("1") of the upper physical page.

The processor 211 (or the read assisting circuit unit 215) can use the transition read voltages corresponding to the lower physical page, the middle physical page and the upper physical page in the preset read voltage set to read the word line in sequence, so as to obtain the storage states of the lower physical page, the middle physical page and the upper physical page of the memory cells of the word lines and accordingly obtain the gray codes of the memory cells. For instance, it is assumed that the processor 211 (or the read assisting circuit unit 215) uses the preset read voltage set V(i) to read the word lines to obtain the gray codes of the memory cells of the word lines. The processor 211 (or the read assisting circuit unit 215) first identifies whether the storage states of all the lower physical pages of all the memory cells are the storage state SL1 or the storage state SL2 by using the transition read voltage $V(i)_4$; next, the processor 211 (or the read assisting circuit unit 215) then identifies whether the storage states of all the middle physical pages of all the memory cells are the storage state SM1, the storage state SM2 or the storage state SM3 by using the transition read voltages $V(i)_2$ and $V(i)_6$; next, the processor 211 (or the read assisting circuit unit 215) then identifies whether the storage states of all the upper physical pages of all the memory cells are the storage state SU1, the storage state SU2, the storage state SU3, the storage state SU4 or the storage state SU5 by using the transition read voltages $V(i)_1$, $V(i)_3$, $V(i)_5$ and $V(i)_7$. Accordingly, the processor 211 (or the read assisting circuit unit 215) can identify the storage states of the lower physical pages, the middle physical pages and the upper physical pages of all the memory cells, and thereby identify the gray codes stored by all the memory cells.

It should be noted that, the identified bit values being the storage states of the upper physical pages of all the memory cells of the word line may be combined into one hard bit codeword corresponding to the upper physical page of the word line; the identified bit values being the storage states of the middle physical pages of all the memory cells of the word line may be combined into one hard bit codeword corresponding to the middle physical page of the word line; the identified bit values being the storage states of the lower physical pages of all the memory cells of the word line may be combined into one hard bit codeword corresponding to the lower physical page of the word line. The preset decoding operation is not yet performed on the hard bit codewords respectively corresponding to the physical pages, and the hard bit codewords may also be referred as a plurality of raw codewords respectively corresponding to the physical pages.

In addition, the rewritable non-volatile memory module 220 with the characteristics of having the physical pages and the corresponding number of the transition read voltages may also be regarded as the rewritable non-volatile memory module 220 (the TLC NAND flash memory module) having a first read voltage pattern (1/2/4). The so-called "1/2/4" corresponds to the total number of the transition read voltages respectively included by "the lower physical page/the middle physical page/the upper physical page". The invention is not limited by the rewritable non-volatile memory module 220 having the first read voltage pattern. The data reading method, the storage controller and the storage device provided by the invention is also applicable to the rewritable non-volatile memory module 220 with other read voltage patterns. The following paragraph is described with reference to FIG. 3B.

Figure 3B:
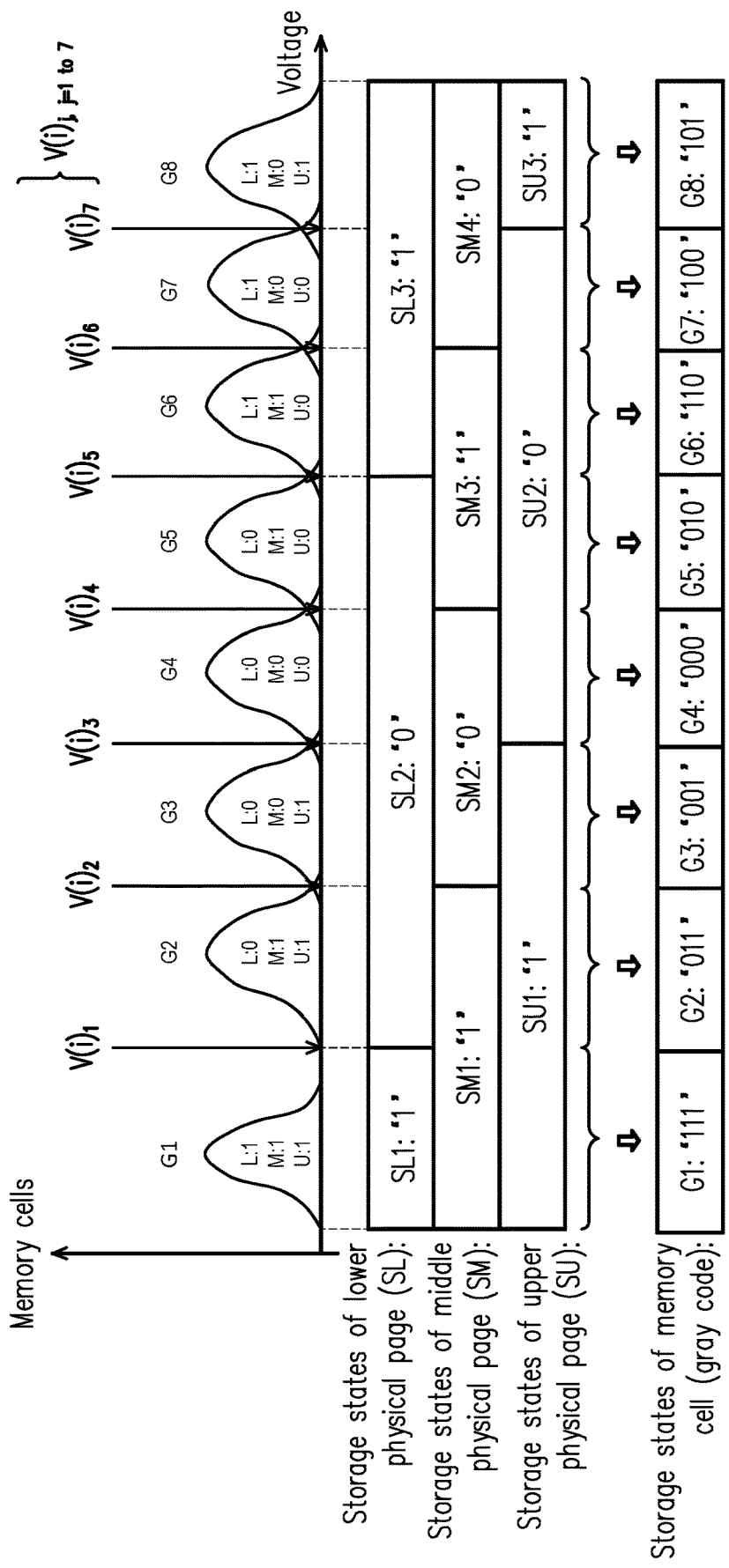
FIG. 3B is a schematic diagram illustrating a threshold voltage distribution of a second read voltage pattern (2/3/2) and a corresponding gray code pattern according to an embodiment of the invention.

FIG. 3B is a schematic diagram illustrating a threshold voltage distribution of a second read voltage pattern (2/3/2) and a corresponding gray code pattern according to an embodiment of the invention. With reference to FIG. 3B, for the rewritable non-volatile memory module 220 (the TLC NAND flash memory module) having a second read voltage pattern (2/3/2), the read voltages $V(i)_1$ and $V(i)_5$ are configured to divide storage states SL1 ("1"), SL2 ("0") and SL3 ("1") of the lower physical page; the read voltages $V(i)_2$, $V(i)_4$ and $V(i)_6$ are configured to divide storage states SM1 ("1"), SM2 ("0"), SM3 ("1") and SM4 ("0") of the middle physical page; the read voltages $V(i)_3$ and $V(i)_7$ are configured to divide the storage states SU1 ("1"), SU2 ("0") and SU3 ("1") of the upper physical page. The so-called "2/3/2" corresponds to the total number of the transition read voltages respectively included by "the lower physical page/the middle physical page/the upper physical page".

According to the transition read voltages $V(i)_1$ to $V(i)_7$ in the preset read voltage set V(i), a gate voltage in each memory cell of the rewritable non-volatile memory module 220 having the second read voltage pattern (2/3/2) may be divided into 8 gray code patterns, such as "L:1 M:1 U:1", "L:0 M:1 U:1", "L:0 M:0 U:1", "L:0 M:0 U:0", "L:0 M:1 U:0", "L:1 M:1 U:0", "L:1 M:0 U:0" and "L:1 M:0 U:1". The 8 gray code patterns may also be expressed by 8 bit value combinations, including "111", "110", "100", "101", "001", "000", "010" and "011". Here, an order of the bit values in each bit value combination is based on an order of storage states of the lower, middle and upper physical pages of the memory cells in that sequence.

Further, with reference to FIG. 3B, a threshold voltage distribution region G1 corresponds to a gray code pattern "111"; a threshold voltage distribution region G2 corresponds to a gray code pattern "011"; a threshold voltage distribution region G3 corresponds to a gray code pattern "001"; a threshold voltage distribution region G4 corresponds to a gray code pattern "000"; a threshold voltage distribution region G5 corresponds to a gray code pattern "010"; a threshold voltage distribution region G6 corresponds to a gray code pattern "110"; a threshold voltage distribution region G7 corresponds to a gray code pattern "100"; a threshold voltage distribution region G8 corresponds to a gray code pattern "101". Further, in this embodiment, if the gray code pattern corresponding to the storage state of one memory cell is "011", that memory cell may be regarded as belonging to the threshold voltage distribution region G2, or the threshold voltage distribution of that memory cell may be regarded as belonging to the threshold voltage distribution region G2.

In this embodiment, the threshold voltage distributions of the physical pages of the memory cells of the word line may have an offset as compared to a preset threshold voltage distribution. Due to the offset of the transition read voltage, preset transition read voltages originally corresponding to preset threshold voltages of the physical pages are no longer suitable for dividing the storage states of the corresponding physical pages. That is to say, in this case, the read bit values stored by the memory cells of the originally read and identified physical page may be distorted. At this time, it is required to perform the soft information operation to obtain the soft information corresponding to the memory cells to assist the processor 211 or the error checking and correcting circuit 214 to further identify the read bit values stored by the physical pages of each of the memory cells or a corresponding confidence value by using the soft information of each of the memory cells and a plurality of confidence tables corresponding thereto. In this way, the error checking and correcting circuit 214 can perform the preset decoding operation (a low density parity check code decoding operation) through the confidence values and the soft information of each memory cell. The following paragraph is described with reference to FIG. 2.

Figure 2:
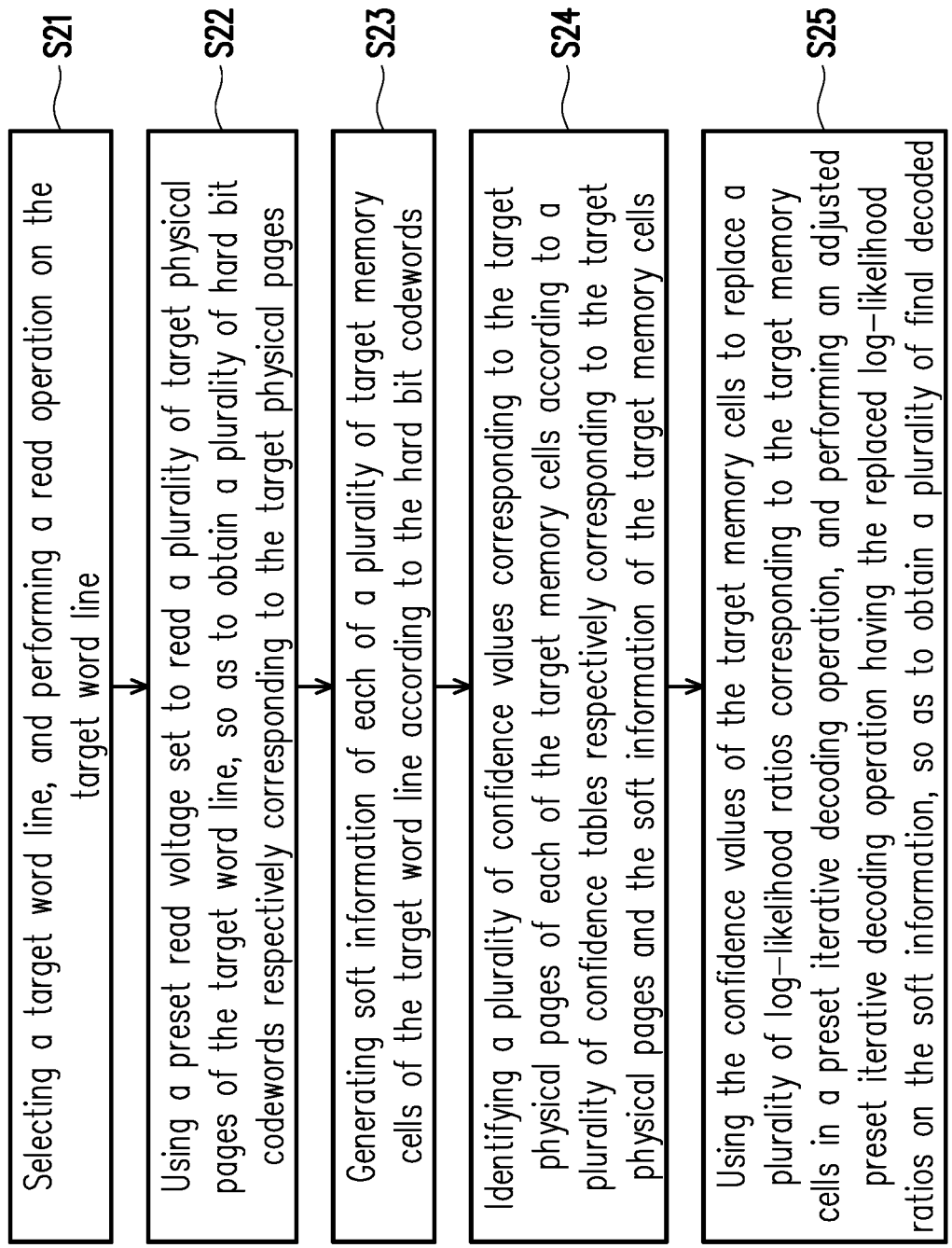
FIG. 2 is a flowchart illustrating a data reading method according to an embodiment of the invention.

FIG. 2 is a flowchart illustrating a data reading method according to an embodiment of the invention. With reference to FIG. 2, in step S21, the processor 211 selects a target word line, and performs a read operation on the target word line. Specifically, the method and the timing for selecting have been described above, and are not repeated hereinafter. However, in another embodiment, the target word line may also refer to a word line corresponding to the data to be read as instructed by the read command.

Next, in step S22, the read assisting circuit unit 215 (or the soft information management circuit 2151) uses a preset read voltage set to read a plurality of target physical pages of the target word line, so as to obtain a plurality of hard bit codewords respectively corresponding to the target physical pages.

Specifically, the read bit values read from a plurality of target memory cells belonging to the same one target physical page by using the corresponding transition read voltage in the preset read voltage set can compose a hard bit codeword corresponding to said one target physical page. For instance, in the example of FIG. 3A, the target word line has three target physical pages (the upper, middle and lower physical pages). When the lower physical pages of all the target memory cells of the target word line are read by using the transition read voltage $V(i)_4$, the hard bit codeword corresponding to the lower physical pages of the target word line may be obtained.

Next, in step S23, the read assisting circuit unit 215 (or the soft information management circuit 2151) generates soft information of each of a plurality of target memory cells of the target word line according to the hard bit codewords.

Specifically, in this embodiment, the soft information includes three patterns, including: first pattern soft information, second pattern soft information and the third pattern soft information. The processor 211 can preset the pattern of the soft information to be one of the three listed above.

More specifically, in response to the soft information preset as the first pattern soft information, the step of generating the soft information of each of the target memory cells of the target word line according to the hard bit codewords includes: performing the preset decoding operation on each of the hard bit codewords by the error checking and correcting circuit 214, so as to obtain a plurality of smallest syndrome codewords respectively corresponding to the hard bit codewords; and composing the soft information of the target memory cells by the soft information management circuit 2151 according to the smallest syndrome codewords respectively corresponding to the target physical pages of the target memory cells. A total number of the bit values being "1" included by the syndrome corresponding to the smallest syndrome codeword may be greater than or equal to 0. The valid codeword may also be regarded as a smallest syndrome codeword.

In other words, for a first preset decoding operation performed on a first hard bit codeword in the hard bit codewords (the first preset decoding operation includes a plurality of iterative decoding operations), each time one iterative decoding operation among the iterative decoding operations is completed, the error checking and correcting circuit obtains a decoded hard bit codeword and a hard bit syndrome corresponding to the decoded hard bit codeword. The error checking and correcting circuit 214 selects a smallest one among the hard bit syndromes obtained from the completed iterative decoding operations as a smallest hard bit syndrome, and identifies the decoded hard bit codeword corresponding to the smallest hard bit syndrome from the decoded hard bit codewords as the smallest syndrome codeword. Here, a total number of the iterative decoding operations is less than or equal to an iteration count threshold.

In other words, after the preset decoding operation performed on the hard bit codewords of the lower physical pages is completed, the error checking and correcting circuit 214 can obtain the smallest syndrome codeword corresponding to the lower physical pages; after the preset decoding operation performed on the hard bit codewords of the middle physical pages is completed, the error checking and correcting circuit 214 can obtain the smallest syndrome codeword corresponding to the middle physical pages; after the preset decoding operation performed on the hard bit codewords of the upper physical pages is completed, the error checking and correcting circuit 214 can obtain the smallest syndrome codeword corresponding to the upper physical pages.

Next, for one specific memory cell, the soft information management circuit 2151 can identify the read bit values of the lower physical pages of that specific memory cell from the smallest syndrome codeword corresponding to the lower physical pages, and identify the read bit values as soft bits corresponding to the lower physical pages in the soft information of that specific memory cell; identify the read bit values of the lower physical pages of that specific memory cell from the smallest syndrome codeword corresponding to the middle physical pages, and identify the read bit values as soft bits corresponding to the middle physical pages in the soft information of that specific memory cell; identify the read bit values of the upper physical pages of that specific memory cell from the smallest syndrome codeword corresponding to the middle physical pages, and identify the read bit values as soft bits corresponding to the upper physical pages in the soft information of that specific memory cell.

It is worth noting that, in this embodiment, each target physical page of one target memory cell corresponds to one soft bit in the soft information of said one target memory cell, and a total number of all the soft bits in the soft information of said one target memory cell is equal to a total number of all the target physical pages of said one target memory cell. For instance, with respect to one memory cell of the TLC NAND flash memory module, the memory cell includes the upper, middle and lower physical pages, and a total number of the upper, middle and lower physical pages is 3 (one memory cell has "three" physical pages). Accordingly, the soft information of one memory cell of the TLC NAND flash memory module includes 3 bit values, and the bit values of the memory cell correspond to the upper, middle and lower physical pages, respectively.

On the other hand, in response to the soft information preset as the second pattern soft information, the step of generating the soft information of each of the target memory cells of the target word line according to the hard bit codewords includes: directly composing the soft information of the target memory cells by using the hard bit codewords respectively corresponding to the target physical pages. Specifically, if the soft information is the second pattern soft information, for one specific memory cell, the soft information management circuit 2151 can identify the read bit values of the lower physical pages of that specific memory cell from the hard bit codewords (a.k.a. hard bit values) corresponding to the lower physical pages, and identify the read bit values as soft bits corresponding to the lower physical pages in the soft information of that specific memory cell; identify the read bit values of the lower physical pages of that specific memory cell from the hard bit codewords corresponding to the middle physical pages, and identify the read bit values as soft bits corresponding to the middle physical pages in the soft information of that specific memory cell; identify the read bit values of the upper physical pages of that specific memory cell from the hard bit codewords corresponding to the middle physical pages, and identify the read bit values as soft bits corresponding to the upper physical pages in the soft information of that specific memory cell. Next, the soft information management circuit 2151 can have the soft bits combined into the soft information of the memory cell.

On the other hand, in response to the soft information preset as the third pattern soft information, the step of generating the soft information of each of the target memory cells of the target word line according to the hard bit codewords includes: selecting one of the hard bit codewords and instructing the error checking and correcting circuit 214 to perform the preset decoding operation on the selected hard bit codeword by the soft information management circuit 2151, so as to obtain the smallest syndrome codeword corresponding to the selected hard bit codeword; and composing the soft information of the target memory cells according to the smallest syndrome codeword of the selected hard bit codeword and all other not-selected hard bit codewords in the hard bit codewords. In other words, for the third pattern soft information, the soft information of one target memory cell at least includes one bit value from the smallest syndrome codeword and one bit value from the hard bit codeword. In an embodiment, the selected smallest syndrome codeword may be the valid codeword. In an embodiment, an error bit count of the selected smallest syndrome codeword may be greater than an error bit count threshold. In an embodiment, a total number of the smallest syndrome codewords being selected may be greater than one.

After the soft information of each of the target memory cell is obtained, in step S24, the read assisting circuit unit 215 (or the confidence table management circuit 2152) can identify a plurality of confidence values corresponding to the target physical pages of each of the target memory cells according to a plurality of confidence tables respectively corresponding to the target physical pages and the soft information of the target memory cells.

Rules for setting the confidence tables are described below with reference to FIG. 4A and FIG. 5A.

In this embodiment, the confidence table of one target physical page includes a plurality of confidence values respectively corresponding to a plurality of threshold voltage distribution regions. Absolute value sizes of a plurality of preset confidence values corresponding to the threshold voltage distribution regions in the confidence table (e.g., a first confidence table) of one target physical page (e.g., a first target physical page) are set by the read assisting circuit unit 215 (or the confidence table management circuit 2152) according to a plurality of voltage relative relations between the transition read voltage (a.k.a. a first transition read voltage) corresponding to the first target physical page in the preset read voltage set and the threshold voltage distribution regions. Here, the absolute value size of one or more of the preset confidence values corresponding to one or more threshold voltage distributions closer to the first transition read voltage in the threshold voltage distribution regions is smaller.

The preset confidence values being positive or negative is set by the read assisting circuit unit according to the bit value corresponding to the first target physical page in the bit values of the gray code patterns corresponding to the threshold voltage distribution regions. Here, in response to the bit value corresponding to the first target physical page in the bit values of the gray code pattern corresponding to one threshold voltage distribution region (e.g., a first threshold voltage distribution region) being "1", the first preset confidence value corresponding to the first threshold voltage distribution region is set as a negative value by the read assisting circuit unit. Here, in response to the bit value corresponding to the first target physical page in the bit values of the gray code pattern corresponding to the first threshold voltage distribution region being "0", the first preset confidence value corresponding to the first threshold voltage distribution region is set as a positive value by the read assisting circuit unit.

FIG. 4A illustrates a schematic diagram for setting a confidence table corresponding to the first read voltage pattern (1/2/4) according to an embodiment of the invention.

With reference to FIG. 4A, for instance, it is assumed that the confidence table management circuit 2152 is setting a confidence table 410 of the lower physical pages. The confidence table 410 includes preset confidence values 410(1) to 410(8) respectively corresponding to the threshold voltage distribution regions G1 to G8. First, the confidence table management circuit 2152 identifies a voltage value of the transition read voltage $V(i)_4$ of the lower physical pages, and sorts the threshold voltage distribution regions G1 to G8 from small to large according to voltage differences between the threshold voltage distribution regions G1 to G8 and the threshold voltage distribution region $V(i)_4$ (if the voltage difference between one specific threshold voltage distribution region and the transition read voltage is smaller, it means that the specific threshold voltage distribution region is closer to the transition read voltage).

Next, the confidence table management circuit 2152 sets the absolute value sizes of the preset confidence values 410(4) and 410(5) of the threshold voltage distribution regions G4 and G5 closest to the transition read voltage $V(i)_4$ in the confidence table 410 as "A"; sets the absolute value sizes of the preset confidence values 410(3) and 410(6) corresponding to the threshold voltage distribution regions G3 and G6 as "B"; sets the absolute value sizes of the preset confidence values 410(2) and 410(7) corresponding to the threshold voltage distribution regions G2 and G7 as "C"; sets the absolute value sizes of the preset confidence values 410(1) and 410(8) corresponding to the threshold voltage distribution regions G1 and G8 as "D". "A", "B", "C" and "D" are used to represent four different values, where $|A|<|B|<|C|<|D|$. That is to say, since the read bit values stored by the memory cell closer to the transition read voltage have a higher false positive rate (the possibility of determining the read bit values wrong is higher), the confidence value of the threshold voltage distribution region closest to the transition read voltage will be the smallest, and the confidence value of the threshold voltage distribution region farthest away from the transition read voltage will be the largest.

Next, the confidence table management circuit 2152 identifies the bit values of the lower physical pages of the gray code patterns corresponding to the threshold voltage distribution regions G1, G2, G3 and G4 as "1", and correspondingly sets the preset confidence values 410(1), 410(2), 410(3) and 410(4) corresponding to the threshold voltage distribution regions G1, G2, G3 and G4 as the negative value. That is, the preset confidence values 410(1), 410(2), 410(3) and 410(4) corresponding to the threshold voltage distribution regions G1, G2, G3 and G4 are finally set as "−D", "−C", "−B" and "−A".

On the other hand, the confidence table management circuit 2152 identifies the bit values of the lower physical pages of the gray code patterns corresponding to the threshold voltage distribution regions G5, G6, G7 and G8 as "0", and correspondingly sets the preset confidence values 410 (5), 410(6), 410(7) and 410(8) corresponding to the threshold voltage distribution regions G5, G6, G7 and G8 as the positive value. That is, the preset confidence values 410(5), 410(6), 410(7) and 410(8) corresponding to the threshold voltage distribution regions G5, G6, G7 and G8 are finally set as "+A", "+B", "+C" and "+D".

By analogy, preset confidence values 420(1) to 420(8) corresponding to the threshold voltage distribution regions G1 to G8 in a confidence table 420 corresponding to the middle physical pages of the first read voltage pattern are set as "−B", −A", +A", +B", "+B", "+A", "−A" and "−B"; preset confidence values 430(1) to 430(8) corresponding to the threshold voltage distribution regions G1 to G8 in a confidence table 430 corresponding to the upper physical pages of the first read voltage pattern are set as "−A", "+A", "+A", "−A", "−A", "+A", "+A" and "−A".

FIG. 5A illustrates a schematic diagram for setting a confidence table corresponding to the second read voltage pattern (2/3/2) according to an embodiment of the invention. With reference to FIG. 5A, preset confidence values 510(1) to 510(8) corresponding to the threshold voltage distribution regions G1 to G8 in a confidence table 510 corresponding to the lower physical pages of the second read voltage pattern are set as "−A", "+A", "+B", "+B", "+A", "−A", "−B" and "−C"; preset confidence values 520(1) to 520(8) corresponding to the threshold voltage distribution regions G1 to G8 in a confidence table 520 corresponding to the middle physical pages of the second read voltage pattern are set as "−B", "−A", "+A", "+A", "−A", "−A", "+A" and "+B"; preset confidence values 530(1) to 530(8) corresponding to the threshold voltage distribution regions G1 to G8 in a confidence table 530 corresponding to the upper physical pages of the second read voltage pattern are set as "−C", "−B", "−A", "+A", "+B", "+B", "+A" and "−A". The confidence table management circuit 2152 can store the confidence tables being set.

FIG. 4B is a schematic diagram illustrating the confidence table corresponding to the first read voltage pattern (1/2/4) according to an embodiment of the invention. FIG. 5B is a schematic diagram illustrating the confidence table corresponding to the second read voltage pattern (2/3/2) according to an embodiment of the invention.

Specifically, step S24 may include steps of: for a first confidence table corresponding to a first target physical page in the target physical pages and first soft information of a first target memory cell in the target memory cells, identifying a first threshold voltage distribution region to which the first target memory cell belongs in the threshold voltage distribution regions according to the first soft information; finding a first preset confidence value corresponding to the first threshold voltage distribution region from the first confidence table according to the first threshold voltage distribution region; and identifying the first preset confidence value as a first confidence value corresponding to the first target physical page in the confidence values of the first target memory cell.

With reference to FIG. 4B, for instance, it is assumed that A=2; B=4; C=6; D=8. The set confidence tables 410 to 430 of the first read voltage pattern are as shown by FIG. 4B. If the soft information of the first target memory cell is "111", the confidence table management circuit 2152 can identify that the first target memory cell belongs to the threshold voltage distribution region G1, and finds that the confidence value corresponding to the lower physical pages of the first target memory cell is "−8" from the confidence table 410 corresponding to the lower physical page; finds that the confidence value corresponding to the middle physical pages of the first target memory cell is "−4" from the confidence table 420 corresponding to the middle physical page; finds that the confidence value corresponding to the upper physical pages of the first target memory cell is "−2" from the confidence table 430 corresponding to the upper physical page.

As another example, with reference to FIG. 5B, for instance, it is assumed that A=2; B=4; C=6. The set confidence tables 510 to 530 of the second read voltage pattern are as shown by FIG. 5B. If the soft information of the first target memory cell is "010", the confidence table management circuit 2152 can identify that the first target memory cell belongs to the threshold voltage distribution region G5, and finds that the confidence value corresponding to the lower physical pages of the first target memory cell is "+2" from the confidence table 510 corresponding to the lower physical page; finds that the confidence value corresponding to the middle physical pages of the first target memory cell is "−2" from the confidence table 520 corresponding to the middle physical page; finds that the confidence value corresponding to the upper physical pages of the first target memory cell is "+4" from the confidence table 530 corresponding to the upper physical page.

Referring to FIG. 2 again, after identifying the confidence values corresponding to the target physical pages of each of the target memory cells, in step S25, the error checking and correcting circuit 214 uses the confidence values of the target memory cells to replace a plurality of log-likelihood ratios corresponding to the target memory cells in a preset iterative decoding operation, and performs an adjusted preset iterative decoding operation having the replaced log-likelihood ratios on the soft information, so as to obtain a plurality of final decoded codewords respectively corresponding to the target physical pages and thereby complete the read operation.

Specifically, the preset decoding operation originally corresponding to the target word line is to perform the iterative decoding operations according to the log-likelihood ratios corresponding to the target memory cells and original soft information corresponding to the target memory cells. The original soft information is not identical to the soft information generated in step S23. The original soft information is obtained through a plurality of assisting read voltage sets corresponding to a plurality of transition read voltages. Here, one assisting read voltage corresponding to one transition read voltages has two paired assisting read voltages. One of the assisting read voltages is less than the transition read voltage one voltage offset, and another one of the assisting read voltages is greater than the transition read voltage one voltage offset.

However, in step S25, the error checking and correcting circuit 214 replaces the log-likelihood ratios of the target memory cells by the confidence values of the target memory cells, replaces the original soft information by the soft information of the target memory cells generated in step S23, and re-performs the preset decoding operation (a.k.a. the adjusted preset decoding operation) on the soft information of the target memory cells. After completing the adjusted preset decoding operation, the error checking and correcting circuit 214 can obtain the final decoded codewords (the valid codewords) and complete the read operation corresponding to the target word line.

It is worth noting that, in the foregoing embodiments, the read assisting circuit unit 215 is implemented in form of hardware circuit, but the invention is not limited thereto. For example, in an embodiment, the read assisting circuit unit 215 may be implemented in form of software as a read assisting program code module with the functions of the read assisting circuit unit 215. The read assisting program code module may include a soft information management program code module and a confidence table management program code module. The soft information management program code module is a program code module with the functions of the soft information management circuit 2151; the confidence table management program code module is a program code module with the functions of the confidence table management circuit 2152. The processor 211 can access and execute the read assisting management program code module (or the soft information management program code module and the confidence table management program code module) to realize the data reading method provided by the invention.

In summary, the data reading method, the storage controller and the storage device provided by the embodiments of the invention can obtain the hard bit codes by reading the target physical pages of the target word line and generate the soft information of each of the target memory cells of the target word line by using the hard bit codewords without preparing the verified data. Next, the data reading method, the storage controller and the storage device provided by the embodiments of the invention can further obtain the confidence values corresponding to the target physical pages by checking the confidence tables corresponding to the target physical pages, use the confidence values of the target memory cells to replace a plurality of log-likelihood ratios corresponding to the target memory cells in a preset iterative decoding operation to obtain a adjusted iterative decoding operation, and thereby perform the adjusted iterative decoding operations according to the confidence values corresponding to the target physical pages of the target memory cells, so as to enhance the decoding capability and improve the efficiency of the read operation. As a result, the correct rate and the reliability of the data read form the target word line may be improved to reduce loading of the decoding operation performed on the read data and thereby improve the overall efficiency of the data reading operation.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data reading method, adapted to a storage device disposed with a rewritable non-volatile memory module, wherein the rewritable non-volatile memory module has a plurality of word lines, wherein each word line among the word lines is coupled to a plurality of memory cells, wherein each memory cell among the memory cells comprises a plurality of physical pages, each physical page among the physical pages is configured to be programmed as a bit value, and the method comprises:

selecting a target word line, and performing a read operation on the target word line;

using a preset read voltage set to read a plurality of target physical pages of the target word line, so as to obtain a plurality of hard bit codewords respectively corresponding to the target physical pages;

generating soft information of each of a plurality of target memory cells of the target word line according to the hard bit codewords;

identifying a plurality of confidence values corresponding to the target physical pages of each of the target memory cells according to a plurality of confidence tables respectively corresponding to the target physical pages and the soft information of the target memory cells, wherein each of the confidence tables has a plurality of preset confidence values respectively corresponding to a plurality of threshold voltage distribution regions, wherein the threshold voltage distribution regions correspond to a plurality of gray code patterns; and using the confidence values of the target memory cells to replace a plurality of log-likelihood ratios corresponding to the target memory cells in a preset decoding operation, and performing an adjusted preset decoding operation having the replaced log-likelihood ratios on the soft information, so as to obtain a plurality of final decoded codewords respectively corresponding to the target physical pages and complete the read operation.

2. The data reading method according to claim 1, wherein the preset decoding operation comprises a plurality of iterative decoding operations applying a low density parity check algorithm.

3. The data reading method according to claim 1, wherein the soft information is preset as first pattern soft information, second pattern soft information or the third pattern soft information, wherein
in response to the soft information preset as the first pattern soft information, the step of generating the soft information of each of the target memory cells of the target word line according to the hard bit codewords comprises:
performing the preset decoding operation on each of the hard bit codewords, so as to obtain a plurality of smallest syndrome codewords respectively corresponding to the hard bit codewords; and
composing the soft information of the target memory cells according to the smallest syndrome codewords respectively corresponding to the target physical pages of the target memory cells,
wherein in response to the soft information preset as the second pattern soft information, the step of generating the soft information of each of the target memory cells of the target word line according to the hard bit codewords comprises:
directly composing the soft information of the target memory cells by using the hard bit codewords respectively corresponding to the target physical pages;
wherein in response to the soft information preset as the third pattern soft information, the step of generating the soft information of each of the target memory cells of the target word line according to the hard bit codewords comprises:
selecting one of the hard bit codewords to perform the preset decoding operation, so as to obtain a smallest syndrome codeword corresponding to the selected hard bit codeword; and
composing the soft information of the target memory cells according to the smallest syndrome codeword corresponding to the selected hard bit codeword and all other not-selected hard bit codewords in the hard bit codewords.

4. The data reading method according to claim 3, wherein the step of performing the preset decoding operation on each of the hard bit codewords to obtain the smallest syndrome codewords respectively corresponding to the hard bit codewords comprises:
for a first preset decoding operation comprising a plurality of iterative decoding operations performed on a first hard bit codeword in the hard bit codewords,
each time one iterative decoding operation among the iterative decoding operations is completed, obtaining a decoded hard bit codeword and a hard bit syndrome corresponding to the decoded hard bit codeword; and
selecting a smallest one among the hard bit syndromes as a smallest hard bit syndrome, and identifying the decoded hard bit codeword corresponding to the smallest hard bit syndrome from the decoded hard bit codewords as the smallest syndrome codeword,
wherein a total number of the iterative decoding operations is less than or equal to an iteration count threshold.

5. The data reading method according to claim 4, wherein each target physical page of one target memory cell corresponds to one soft bit in the soft information of said one target memory cell, and a total number of all the soft bits in the soft information of said one target memory cell is equal to a total number of all the target physical pages of said one target memory cell.

6. The data reading method according to claim 1, wherein the step of identifying the confidence values corresponding to the target physical pages of each of the target memory cells according to the confidence tables respectively corresponding to the target physical pages and the soft information of the target memory cells comprises:
for a first confidence table corresponding to a first target physical page in the target physical pages and first soft information of a first target memory cell in the target memory cells,
identifying a first threshold voltage distribution region to which the first target memory cell belongs in the threshold voltage distribution regions according to the first soft information;
finding a first preset confidence value corresponding to the first threshold voltage distribution region from the first confidence table according to the first threshold voltage distribution region; and
identifying the first preset confidence value as a first confidence value corresponding to the first target physical page in the confidence values of the first target memory cell.

7. The data reading method according to claim 6, wherein absolute value sizes of the preset confidence values corresponding to the threshold voltage distribution regions in the first confidence table of the first target physical page are set according to a plurality of voltage relative relations between a first transition read voltage corresponding to the first target physical page in the preset read voltage set and the threshold voltage distribution regions,
wherein the absolute value size of one or more of the preset confidence values corresponding to one or more threshold voltage distributions regions closer to the first transition read voltage among the threshold voltage distribution regions is smaller,
wherein the preset confidence values being positive or negative is set according to a bit value corresponding to the first target physical page in a plurality of bit values of the gray code patterns corresponding to the threshold voltage distribution regions,
wherein in response to the bit value corresponding to the first target physical page in the bit values of the gray code pattern corresponding to the first threshold voltage distribution region being "1", the first preset confidence value corresponding to the first threshold voltage distribution region is set as a negative value,
wherein in response to the bit value corresponding to the first target physical page in the bit values of the gray code pattern corresponding to the first threshold voltage distribution region being "0", the first preset value confidence corresponding to the first threshold voltage distribution region is set as a positive value.

8. A storage controller, configured to control a storage device having a rewritable non-volatile memory module, the storage controller comprising:
a connection interface circuit, configured to couple to a host system;
a memory interface control circuit, configured to couple to the rewritable non-volatile memory module, wherein the rewritable non-volatile memory module has a plurality of word lines, wherein each word line among the word lines is coupled to a plurality of memory cells, wherein each memory cell among the memory cells comprises a plurality of physical pages, and each physical page among the physical pages is configured to be programmed as a bit value;
a read assisting circuit unit;
an error checking and correcting circuit; and
a processor, coupled to the connection interface circuit, the memory interface control circuit, the read assisting circuit unit and the error checking and correcting circuit,
wherein the processor is configured to select a target word line among the word lines of the rewritable non-volatile memory module, and perform a read operation on the target word line,
wherein the read assisting circuit unit is configured to use a preset read voltage set to read a plurality of target physical pages of the target word line, so as to obtain a plurality of hard bit codewords respectively corresponding to the target physical pages,
wherein the read assisting circuit unit is further configured to generate soft information of each of a plurality of target memory cells of the target word line according to the hard bit codewords,
wherein the read assisting circuit unit is further configured to identify a plurality of confidence values corresponding to the target physical pages of each of the target memory cells according to a plurality of confidence tables respectively corresponding to the target physical pages and the soft information of the target memory cells, wherein each of the confidence tables has a plurality of preset confidence values respectively corresponding to a plurality of threshold voltage distribution regions, wherein the threshold voltage distribution regions correspond to a plurality of gray code patterns,
wherein the error checking and correcting circuit is configured to use the confidence values of the target memory cells to replace a plurality of log-likelihood ratios corresponding to the target memory cells in a preset decoding operation, and perform an adjusted preset decoding operation having the replaced log-likelihood ratios on the soft information, so as to obtain a plurality of final decoded codewords respectively corresponding to the target physical pages and thereby complete the read operation.

9. The storage controller according to claim 8, wherein the preset decoding operation comprises a plurality of iterative decoding operations applying a low density parity check algorithm.

10. The storage controller according to claim 8, wherein the soft information is preset as first pattern soft information, second pattern soft information or the third pattern soft information, wherein
in response to the soft information preset as the first pattern soft information,
the error checking and correcting circuit performs the preset decoding operation on each of the hard bit codewords, so as to obtain a plurality of smallest syndrome codewords respectively corresponding to the hard bit codewords,
wherein the read assisting circuit unit composes the soft information of the target memory cells according to the smallest syndrome codewords respectively corresponding to the target physical pages of the target memory cells,
wherein in response to the soft information preset as the second pattern soft information,
the read assisting circuit unit directly composes the soft information of the target memory cells by using the hard bit codewords respectively corresponding to the target physical pages,
wherein in response to the soft information preset as the third pattern soft information,
the error checking and correcting circuit selects one of the hard bit codewords to perform the preset decoding operation, so as to obtain the smallest syndrome codeword corresponding to the selected hard bit codeword,
wherein the read assisting circuit unit composes the soft information of the target memory cells according to the smallest syndrome codeword of the selected hard bit codeword and all other not-selected hard bit codewords in the hard bit codewords.

11. The storage controller according to claim 10, wherein in the operation where the error checking and correcting circuit performs the preset decoding operation on each of the hard bit codewords, so as to obtain the smallest syndrome codewords respectively corresponding to the hard bit codewords,
for a first preset decoding operation comprising a plurality of iterative decoding operations performed on a first hard bit codeword in the hard bit codewords,
each time one iterative decoding operation among the iterative decoding operations is completed, the error checking and correcting circuit obtains a decoded hard bit codeword and a hard bit syndrome corresponding to the decoded hard bit codeword,
wherein the error checking and correcting circuit selects a smallest one among the hard bit syndromes as a smallest hard bit syndrome, and identifies the decoded hard bit codeword corresponding to the smallest hard bit syndrome from the decoded hard bit codewords as the smallest syndrome codeword, wherein a total number of the iterative decoding operations is less than or equal to an iteration count threshold.

12. The storage controller according to claim 11, wherein each target physical page of one target memory cell corresponds to one soft bit in the soft information of said one target memory cell, and a total number of all the soft bits in the soft information of said one target memory cell is equal to a total number of all the target physical pages of said one target memory cell.

13. The storage controller according to claim 8, wherein in the operation where the read assisting circuit unit identifies the confidence values corresponding to the target physical pages of each of the target memory cells according to the confidence tables respectively corresponding to the target physical pages and the soft information of the target memory cells,
for a first confidence table corresponding to a first target physical page in the target physical pages and first soft information of a first target memory cell in the target memory cells,
the read assisting circuit unit identifies a first threshold voltage distribution region to which the first target memory cell belongs in the threshold voltage distribution regions according to the first soft information,
wherein the read assisting circuit unit finds a first preset confidence value corresponding to the first threshold voltage distribution region from the first confidence table according to the first threshold voltage distribution region,
wherein the read assisting circuit unit identifies the first preset confidence value as a first confidence value corresponding to the first target physical page in the confidence values of the first target memory cell.

14. The storage controller according to claim 13, wherein absolute value sizes of the preset confidence values corresponding to the threshold voltage distribution regions in the first confidence table of the first target physical page are set by the read assisting circuit unit according to a plurality of voltage relative relations between a first transition read voltage corresponding to the first target physical page in the preset read voltage set and the threshold voltage distribution regions, wherein the absolute value size of one or more of the preset confidence values corresponding to one or more threshold voltage distributions closer to the first transition read voltage in the threshold voltage distribution regions is smaller, wherein the preset confidence values being positive or negative is set by the read assisting circuit unit according to the bit value corresponding to the first target physical page in the bit values of the gray code patterns corresponding to the threshold voltage distribution regions, wherein in response to the bit value corresponding to the first target physical page in the bit values of the gray code pattern corresponding to the first threshold voltage distribution region being "1", the first preset confidence value corresponding to the first threshold voltage distribution region is set as a negative value by the read assisting circuit unit, wherein in response to the bit value corresponding to the first target physical page in the bit values of the gray code pattern corresponding to the first threshold voltage distribution region being "0", the first preset confidence value corresponding to the first threshold voltage distribution region is set as a positive value by the read assisting circuit unit.

15. A storage device, the storage device comprising:

a rewritable non-volatile memory module, wherein the rewritable non-volatile memory module has a plurality of word lines, wherein each of the word lines is coupled to a plurality of memory cells, wherein each memory cell among the memory cells comprises a plurality of physical pages, and each physical page among the physical pages is configured to be programmed as a bit value;

a memory interface control circuit, configured to couple to the rewritable non-volatile memory module; and a processor, coupled to the memory interface control circuit, wherein the processor loads in and execute a read assisting program code module to realize a data reading method, and the data reading method comprises steps of:

selecting a target word line, and performing a read operation on the target word line;

using a preset read voltage set to read a plurality of target physical pages of the target word line, so as to obtain a plurality of hard bit codewords respectively corresponding to the target physical pages;

generating soft information of each of a plurality of target memory cells of the target word line according to the hard bit codewords;

identifying a plurality of confidence values corresponding to the target physical pages of each of the target memory cells according to a plurality of confidence tables respectively corresponding to the target physical pages and the soft information of the target memory cells, wherein each of the confidence tables has a plurality of preset confidence values respectively corresponding to a plurality of threshold voltage distribution regions, wherein the threshold voltage distribution regions correspond to a plurality of gray code patterns; and using the confidence values of the target memory cells to replace a plurality of log-likelihood ratios corresponding to the target memory cells in a preset decoding operation, and performing an adjusted preset decoding operation having the replaced log-likelihood ratios on the soft information, so as to obtain a plurality of final decoded codewords respectively corresponding to the target physical pages and complete the read operation.

* * * * *